United States Patent
Haider (10) Patent No.: US 6,212,050 B1
(45) Date of Patent: Apr. 3, 2001

(54) CIRCUIT AND METHOD FOR PROTECTING INPUT/OUTPUT STAGE OF A LOW VOLTAGE INTEGRATED CIRCUIT DEVICE FROM A FAILURE OF THE INTERNAL POWER SUPPLY OR IN THE POWER-UP SEQUENCING OF POWER SUPPLIES

(75) Inventor: Nazar S. Haider, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/286,496

(22) Filed: Apr. 5, 1999

(51) Int. Cl.[7] .................................................. H02H 3/18
(52) U.S. Cl. ............................ 361/86; 361/91.5; 361/111
(58) Field of Search ................................... 361/91.1, 91.5, 361/78, 86, 111

(56) References Cited

U.S. PATENT DOCUMENTS 5,852,540 * 12/1998 Haider .................................. 361/111
5,907,464 * 5/1999 Maloney et al. ...................... 361/111

* cited by examiner

Primary Examiner—Michael J. Sherry
(74) Attorney, Agent, or Firm—Blakely, Sokoloff, Taylor & Zafman LLP (57) ABSTRACT

A circuit for protecting internal logic circuits of an integrated circuit (IC) device from a failure of internal voltage supply is disclosed. A protection circuit is connected between the internal power supply and an external power supply. The protection circuit reduces the external power to the internal logic circuits. A pass circuit is connected to the protection circuit and the internal power supply. The pass circuit is configured to reduce the input voltage difference in the protection circuit in the event of a failure of the internal power supply to prevent a failure of the protection circuit. The voltage level of the external power supply is typically higher than the internal supply voltage level, and exposure to the full external voltage level may disable the protection circuit.

10 Claims, 5 Drawing Sheets

CIRCUIT AND METHOD FOR PROTECTING INPUT/OUTPUT STAGE OF A LOW VOLTAGE INTEGRATED CIRCUIT DEVICE FROM A FAILURE OF THE INTERNAL POWER SUPPLY OR IN THE POWER-UP SEQUENCING OF POWER SUPPLIES

FIELD OF THE INVENTION

The present invention relates generally to integrated circuits, and more specifically to protecting input/output buffer circuits from differences in supply voltage levels.

BACKGROUND OF THE INVENTION

As process technology shrinks the feature sizes of transistors, integrated circuit operating voltages must be reduced every process generation to limit the tolerant electric fields across the terminals of the transistors. In certain semiconductor manufacturing processes, voltages in excess of 2.0 V across the gate-drain junctions of the transistors pose a potential for gate oxide breakdown, thus negatively impacting the reliability and quality of the devices produced through these processes.

Figure 1:
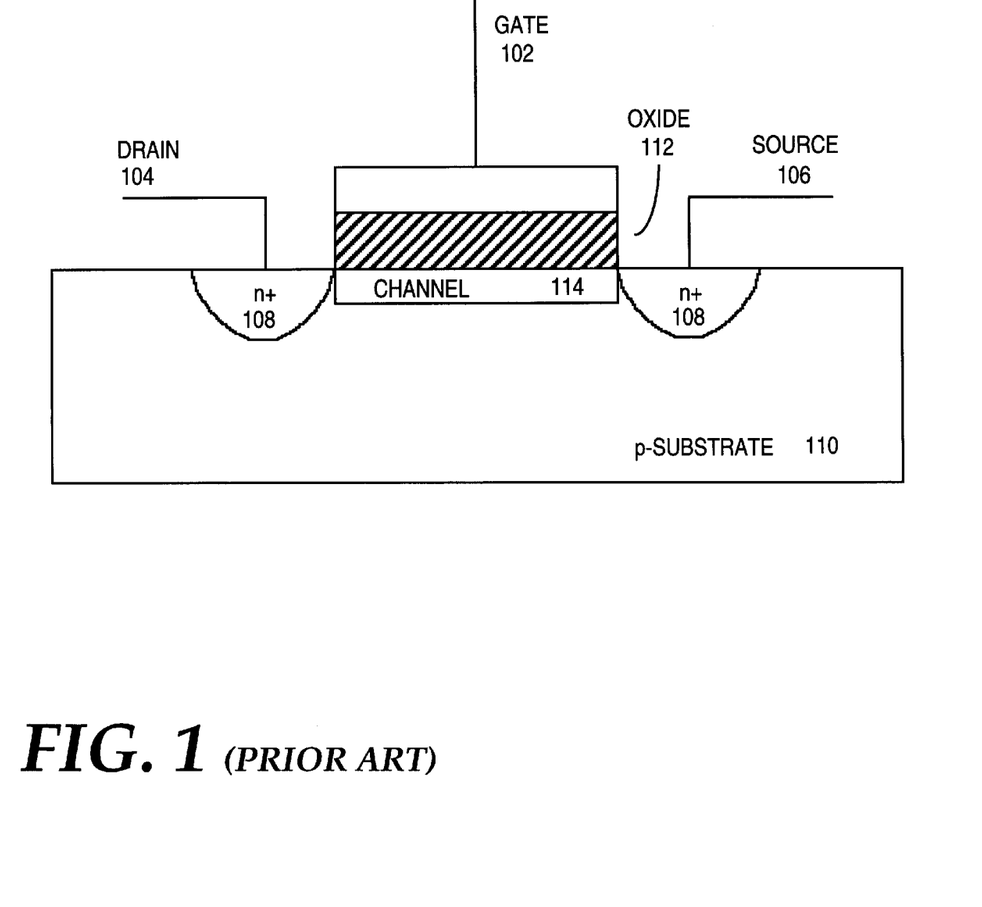
FIG. 1 is a cross-sectional representation of a field effect transistor.

FIG. 1 is a cross-sectional representation of the composition of a typical n-channel MOSFET device. An n-channel MOSFET is composed of two n+ regions 108 embedded within a p-substrate 110. Gate 102 is separated from the substrate 110 by oxide layer 112. Channel 114 is a conducting n-type region which is formed when the gate 102 is brought positive with respect to the source 106 and substrate 110. Reducing the transistor size affects not only the dimension of the transistor, but the performance characteristics of the transistor, as well. For example, reducing the lateral dimension of a transistor pushes the drain 104 and source 106 closer to one another. This effectively reduces the amount of time required for electrons to flow from the drain to the source. Making the oxide layer 112 thinner can also enhance the performance of the transistor. A thinner oxide layer creates a stronger effective electric field and reduces the threshold voltage, $V_t$, thus increasing the effect of the gate voltage on electron flow.

Shrinking a transistor, however, makes it less tolerant to high voltage differentials between its terminals. For example, if the drain and source are too close together, "pun-ch through" may occur. Pun-ch through results from the flow of electrons between the drain and source even if no channel is created. Similarly, if the oxide layer 112 is made too thin, an excessive gate voltage could cause oxide breakdown which results in a short circuit between the three terminals. Even if breakdown does not occur, it is possible for transistor performance to degrade over time through oxide charging effects. Thus, shrinking a transistor lowers the tolerance of the transistor with regard to gate voltages. Consequently, if the gate of the transistor is normally connected to an internal voltage supply, the supply voltage level must be reduced below the maximum tolerable terminal voltage of the transistor.

New integrated circuit devices often incorporate transistors produced with the latest process technology since they feature faster performance and lower power supply requirements. However, in order to maintain compatibility with previous generation products, it is often necessary to continue to support higher voltages at the input/output pins of these devices. For example, older generation computer circuits utilizing CMOS or TTL devices may require supply voltages from 2.5 V to 5 V. These voltage requirements may thus force the input/output transistors produced by a given semiconductor production process to be tolerant of voltages higher than are supported by that process technology.

One method of interfacing low voltage integrated circuit (IC) devices to higher voltage circuits is to provide protection transistors as buffers on the input and output stages of the integrated circuit. These buffers use the internal supply voltage ($V_{cc}$) of the IC to bias the gates of the input and output transistors to a value which is lower than the external voltage level. Thus, as long as the internal voltage supply operates properly, the devices within the core and the input/output stage operate safely. If, however, the internal voltage supply either fails to turn on, or turns on after the higher external voltage is present on the input/output terminals of the device, the voltage reducing buffers can be rendered inoperable. This internal voltage supply failure is referred to herein as a "power sequencing problem" and can result in potentially irreversible damage to the remaining circuits within the device.

It is therefore an intended advantage of the present invention to provide a circuit which protects the input/output stage of a low voltage integrated circuit device from a failure of the internal voltage supply or a difference in the power-up sequencing of supply voltage levels.

SUMMARY OF THE INVENTION

A circuit is disclosed for protecting the internal logic circuits of an integrated circuit (IC) device from a failure of an internal supply voltage. A protection circuit is coupled to an internal power supply and an external power supply. The internal power supply provides an internal voltage, and the external power supply provides an external voltage. The protection circuit reduces the external voltage to an acceptable supply voltage level for internal logic circuits within the IC device. The protection circuit itself has a maximum terminal voltage difference, which, if exceeded, causes a failure of the protection circuit. The circuit also includes a pass circuit coupled between the protection circuit and the internal power supply. The pass circuit reduces the terminal voltage difference across the protection circuit in the event of a failure of the internal power supply.

In one embodiment of the present invention, the pass circuit is connected between a power supply circuit and a variable voltage supply circuit. The power supply circuit provides the internal voltage to the internal logic circuits within the IC. The variable voltage supply circuit is connected to the external power supply. Upon a failure of the internal voltage, the variable voltage supply circuit provides a trigger voltage to the power supply circuit through the pass circuit. The trigger voltage causes the power supply circuit to provide a bias voltage to the protection circuit. This bias voltage reduces the voltage difference across the terminals of the protection circuit and prevents the protection circuit from being exposed to a voltage which may exceed the maximum terminal voltage difference of the protection circuit.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A circuit for maintaining a bias voltage for input/output protection circuits within an integrated circuit is described. In the following description, numerous specific details are set forth in order to provide a thorough understanding of the present invention. However, it will be understood by those skilled in the art that the present invention may be practiced without these specific details. In other instances, well-known structures, circuits, and devices are shown in block diagram form to facilitate explanation.

Figure 2:
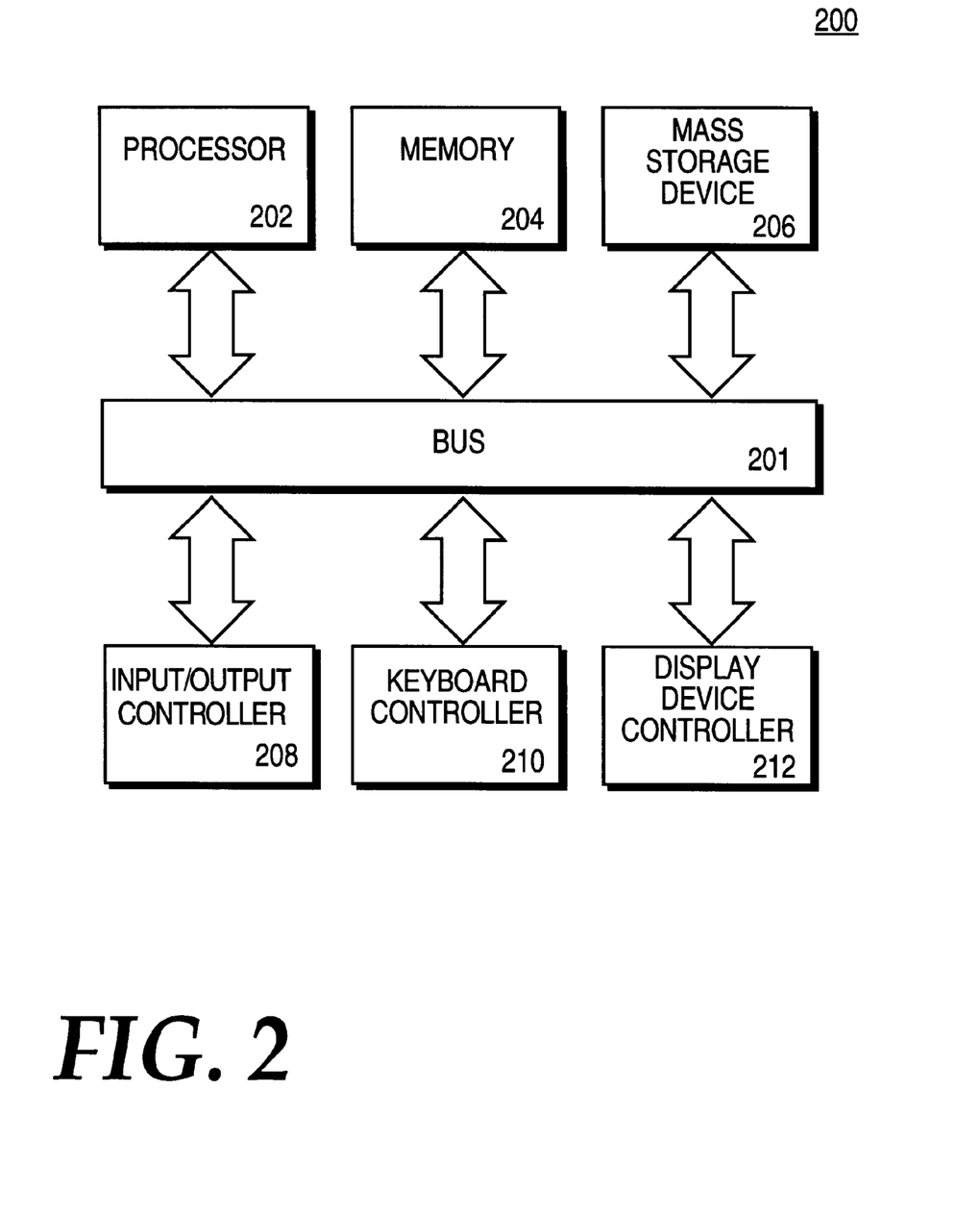
FIG. 2 is a block diagram of a computer system which includes an embodiment of the present invention.

FIG. 2 illustrates a block diagram of a computer system in which the present invention may be used. The computer system 200 includes a processor 202 coupled through a bus 201 to a memory 204 (such as random access memory, RAM, or read-only memory, ROM) and a mass storage device 206 (such as a hard disk). A keyboard controller 210 is coupled to bus 201 for receiving commands or data entry through a keyboard, mouse, or similar input device (not shown to avoid obscuring the present invention). A display device controller 212 is also coupled to bus 201 for providing output through an appropriately coupled display device (not shown to avoid obscuring the present invention). Also coupled to bus 201 may be an input/output controller 208 for interfacing processor 202 to other devices such as network interface devices and the like. It should be noted that the architecture of FIG. 2 is provided only for purposes of illustration, and that a computer system which implements, or is used in conjunction with the present invention is not limited to this specific architecture.

Figure 3:
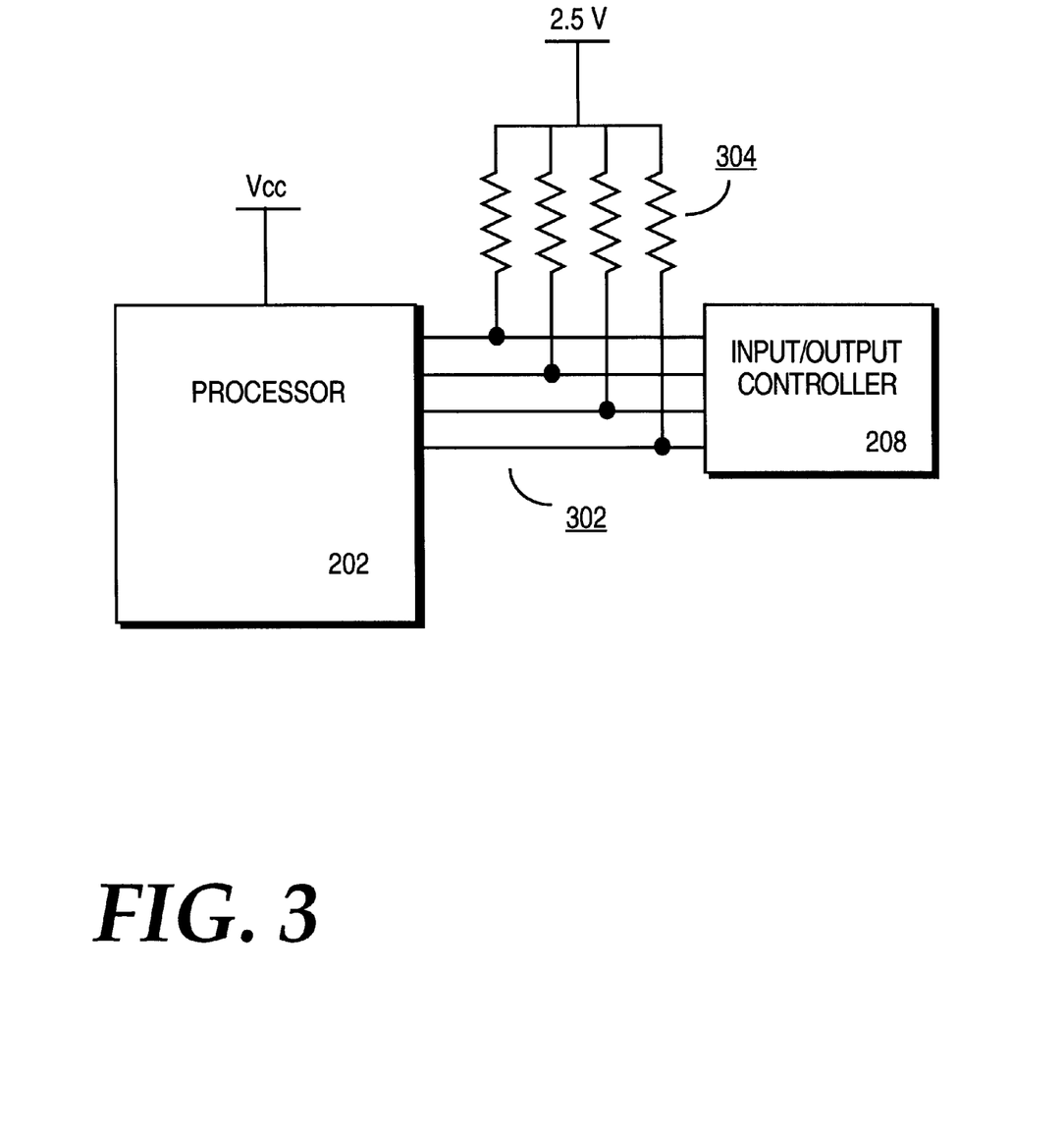
FIG. 3 is block diagram of two components of the circuit of FIG. 1 connected through a representative bus connection, in which one or both of the components includes an embodiment of the present invention.

Certain devices within computer system 200 may represent devices manufactured through production processes which require reduced supply voltage levels. However, certain other devices within computer system 200 may represent older components or components which require higher supply voltage levels. FIG. 3 illustrates a typical interconnection between two components within computer system 200. Processor 202 is connected to input/output controller 208 through a series of wires or circuit traces 302. Processor 202 also includes a separate line for providing an internal voltage level, $V_{cc}$. For some newer generation integrated circuit devices, $V_{cc}$ may be 1.8 V or lower. The four wires 302 shown represent a subset of the wires which make up bus 201 within computer system 200. In the bus-based computer system illustrated in FIG. 3, the wires connecting the components are pulled up to an open-drain termination voltage of 2.5 V through pull-up resistors 304. The 2.5 V level is meant to be illustrative of a termination voltage level which is typically used by the output buffers of general CMOS (Complementary Metal Oxide Semiconductor) transistor circuits to drive a logic "1" onto the bus. A CMOS voltage level, such as 2.5 V, however, may be too high for IC devices which are designed to accommodate an internal voltage level of 1.8 V to 2.0 V.

Figure 4:
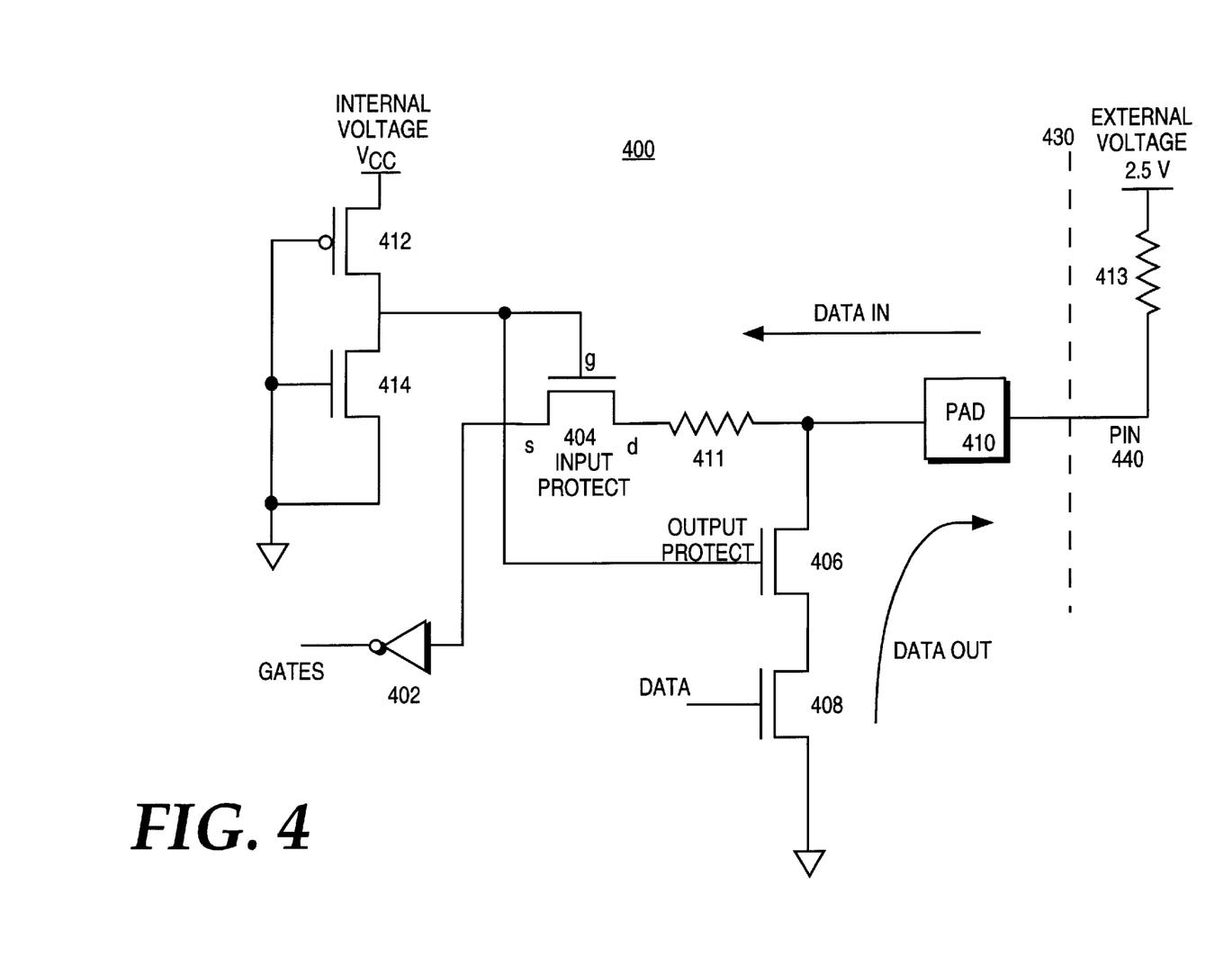
FIG. 4 illustrates input/output protection circuitry which is used in conjunction with the present invention.

One method of maintaining compatibility with higher supply voltages is to provide high voltage tolerant protection transistors (buffers) on the input/output stages of a device. FIG. 4 illustrates an input/output buffer arrangement utilized on certain microprocessors and other like devices, such as processor 202 in FIG. 3. Line 430 represents the physical boundary of the package which contains the device. Circuit 400 illustrates the input/output stage of the device circuit and is part of the circuit which is inside the device package. Pin 440 extends from the device package and provides the electrical and physical point of connection to the device. Also shown in device circuit 400 is pad 410. In one embodiment, pad 410 represents a metal pad which may be used for connecting the silicon die to the package pins using bond wires.

In circuit 400, separate input and output protection transistors 404 and 406 serve to buffer internal logic circuits within the device (also referred to as "core" circuits) from the higher voltages present on the input/output pins of the device. For example, in circuit 400, a standard CMOS compatible 2.5 V level would normally be present at the input of circuit 400 through pin 440. If the core circuits within the device can tolerate a maximum of only 2.1 V, the 2.5 V input level would represent an unacceptably high voltage.

Output data in circuit 400 is transmitted to pin 440 through an n-channel field effect transistor (FET) 408. Similarly, input data is transmitted from pin 440 to circuit 400 through an n-channel input FET 404. Although FIG. 4 illustrates separate protection transistors for both the input and output circuits, it will be appreciated that a single protection transistor may serve to buffer both input and output circuits, or that only the input or output circuit is coupled to an external supply voltage through a protection transistor.

N-channel transistor 406 acts as a protection device for the output stage of circuit 400. The drain terminal of transistor 406 is connected to pin 440, and the source terminal of transistor 406 is connected to the drain terminal of transistor 408. Likewise, N-channel transistor 404 acts as a protection device for the input stage of circuit 400. The drain terminal of transistor 404 is connected to pin 440 through a resistor 411. Resistor 411 is typically a low impedance resistor which provides protection from electrostatic discharge (ESD) current spikes. The source terminal of transistor 404 is connected to the gates of the core circuits through buffer 402. The gate terminals of both input protection transistor 404 and output protection transistor 406 are connected to internal voltage, $V_{cc}$, through an inverter circuit containing p-channel FET 412 and n-channel FET 414 connected in series. In many applications, the internal voltage may be one to two volts lower than the external open-drain termination voltage (hereinafter referred to as the "external" voltage) on pin 440. In the circuit of FIG. 4, it is assumed that $V_{cc}$ is 1.8 V, and the external voltage is 2.5 V.

For a standard n-channel MOSFET, the gate-source voltage $V_{gs}$ must be greater than or equal to the threshold voltage, $V_t$, of the transistor in order for the transistor to conduct current from the drain to the source. This is due to the fact that a MOSFET drops a threshold voltage across its terminals. The threshold voltage is the voltage differential between the gate and the source which will cause the transistor to turn on (conduct). For a given semiconductor production process, $V_t$ for a field effect transistor may be approximately 0.4 V to 0.5 V, and improved processes which produce smaller transistors may yield even lower threshold voltages. Because the gate terminals of protection transistors 404 and 406 are tied to $V_{cc}$, both transistors are always on, since the gate is connected to $V_{cc}$ through transistor 412.

In circuit 400, the input of the core circuits is represented by gate 402. The voltage level for the input stage of gate 402 equals the source voltage $V_s$ for input protection transistor 404. As long as input transistor 404 is on, $V_s=V_{cc}-V_t$. Thus, the voltage at the input of buffer 402 and the core circuits is a maximum of $V_{cc}-V_t$, instead of the external voltage present on pin 440. In one embodiment of FIG. 4, $V_{cc}$ is 1.8 V and $V_t$ is 0.4 V, so $V_s$ is approximately 1.4 V. This voltage level is sufficient to drive the input stage of many low-tolerant circuits, yet low enough to prevent oxide breakdown of the transistors.

The output of the core circuits in circuit 400 is provided by transistor 408. If circuit 400 drives a logic "1" onto pin 440, transistor 408 is off since the data is "0" and $V_{gs}$ for transistor 408 is 0 V. In this case, the pull-up resistor 413 pulls pin 440 to 2.5 V, thus providing the logic "1". However, if circuit 400 drives a logic "0" onto pin 440, the data line to transistor 408 goes to $V_{cc}$, thus turning transistor 408 on. In this case transistor 406 is also on, since its gate is connected to $V_{cc}$ through transistor 412. Since the drain of transistor 408 is connected to the source of transistor 406, $V_d$ for transistor 408 is limited by $V_s$ of transistor 406. As explained above, $V_s$ for a MOSFET is limited to $V_{cc}-V_t$. Thus, the drain voltage for output transistor 408 is limited by the difference in the core supply voltage and the threshold voltage for transistor 406. In the example of circuit 400, the drain voltage for transistor 408 would be 1.8 V–0.4 V or 1.4 V. Thus, the output stage of circuit 400 is protected against a higher external voltage on pin 440.

The protection transistors 404 and 406 are themselves prevented from failing since their gate terminals are tied to $V_{cc}$ and their drain terminals are tied to the external voltage. If the external voltage is 2.5 V and $V_{cc}$ is 1.8 V, then the difference in voltage between the gate and drain for each of these transistors is approximately 0.7 V (2.5 V–1.8 V). This voltage level is well below the 2.5 V external voltage level and is within the tolerance range of most FET devices.

FIG. 4 thus illustrates a circuit which uses an internal voltage to bias the gates of n-channel input and output CMOS protection transistors. The circuit protection provided by circuit 400 however, relies on the reliable maintenance of the internal voltage on the gates of the protection transistors. As long as the internal voltage is reliably provided, transistors 404 and 406 remain on, and the input and output stages of the core circuits remain protected. If, however, the internal voltage either fails to turn on, or is delayed in turning on relative to a higher external voltage on pin 440, protection transistors 404 and 406 will not turn on, and will then be exposed to this higher external voltage level. This can eventually result in a system failure due to loss of the protection transistors. Such a power sequencing problem could be caused by several reasons, such as the failure of a particular power supply circuit or the use of different power regulators which cause power to be delivered to the core circuit at different times. Regardless of the cause, a power sequencing problem can potentially result in irreversible damage to the device if the low tolerance circuitry is exposed too long to a higher than tolerable voltage.

Figure 5:
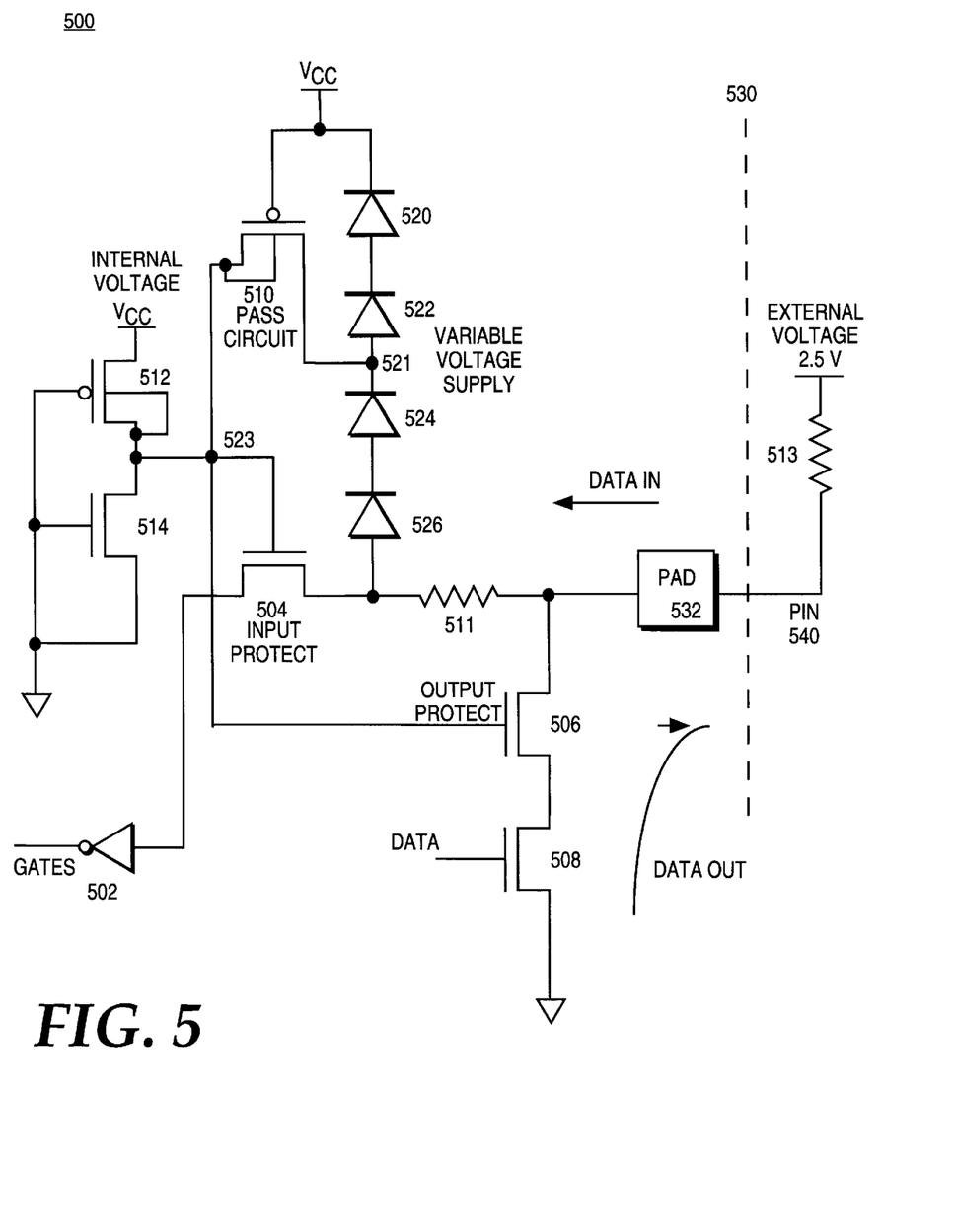
FIG. 5 illustrates a pass circuit for maintaining a bias voltage for protection devices according to one embodiment of the present invention.

FIG. 5 illustrates a circuit according to one embodiment of the present invention which provides a solution to the power sequencing problem which can disable the protection circuit of FIG. 4. Like FIG. 4, FIG. 5 illustrates a device containing an internal input/output circuit 500 within device package boundary 530. External pin 540 connects the internal circuit 500 and pad 532 to a 2.5 V external voltage level. Data is input to core circuits through input transistor 504 and buffer 502; and data is output from core circuits through output transistor 508 and output protection transistor 506. As in FIG. 4, transistors 512 and 514 serve as an inverting power supply connecting internal voltage, $V_{cc}$, to the logic circuits within the integrated circuit device.

Like transistors 404 and 406 in circuit 400, transistors 504 and 506 in circuit 500 serve to protect the core circuits from the high external source voltage at pin 540. Unlike circuit 400 in FIG. 4, however, the gate terminal of the input protection transistor 504 and the gate terminal of the output protection transistor 506 are not tied to $V_{cc}$ through only the inverter circuit of transistors 512 and 514. Instead, in one embodiment of the present invention, the gates of these transistors are connected to the source of p-channel pass transistor 510. The gate of pass transistor 510 is connected to internal voltage $V_{cc}$ so that transistor 510 is off (non-conducting) under normal circumstances, since a p-channel FET does not conduct unless the gate voltage is lower than the source voltage by the threshold voltage of the transistor.

Most field-effect transistors used in modern integrated circuits comprise four connections, one each for the gate, source, and drain, as well as one for the bulk (also referred to as an n-well for a p-channel FET, or a p-well for an n-channel FET). For the p-channel transistor illustrated in FIG. 1, the bulk (or p-well) is represented by p-substrate 110. In typical prior art circuits the bulk is usually connected to $V_{cc}$ unless indicated otherwise. In the case where the bulk is connected to $V_{cc}$, when $V_{cc}$ fails, the potential of the bulk will go to zero volts. In this case, the voltage across the transistor will be limited by the voltage drop across the forward-biased diode formed by the source (or drain) junction and the bulk. For typical FET devices, this voltage drop equals 0.6 to 0.7 volts.

In one embodiment of the present invention, the bulk (or n-well) of pass transistor 510 is connected to the source terminal of the transistor. In the event of a failure of $V_{cc}$, the voltage of the bulk will not go to zero volts, but will instead track the voltage at the source of transistor 510. In this case, if $V_{cc}$ goes to zero volts, the voltage of the source and bulk of transistor 510 will correspond to the voltage at the drain terminal of transistor 510. The voltage at the source of transistor 510 will not be limited to the forward voltage drop of the drain-bulk diode, as is the case when the bulk is connected to $V_{cc}$.

As process sizes decrease, $V_{cc}$ levels for the integrated circuits produced by these processes also decrease. In FIG. 5, it is assumed that $V_{cc}$ is on the order of 0.9 V to 1.0 V corresponding to the voltage supply levels of newer integrated circuit devices. In one embodiment of the present invention, a chain of diodes 526, 524, 522, 520 is connected from pin 540 to $V_{cc}$ through a 300-ohm resistor 511. It is further assumed that diodes with a forward voltage drop of 0.6 V to 0.7 V are used in the diode chain. Diodes 520, 522, 524, and 526 are selected both in number and forward voltage drop to be sufficient to drop the external voltage to 0 V in the event of a failure of the internal supply voltage, and to compensate for any diode overshoot or undershoot conditions. A fractional voltage is taken from node 521 between diodes 522 and 524 to the drain of pass transistor 510. The voltage level at the drain of transistor 510 (node 521) depends on whether $V_{cc}$ is on or off. Under normal conditions when the $V_{cc}$ is on, transistor 510 is off since the gate voltage of the p-channel FET 510 is more positive than the drain voltage. In this case, the diode chain does not conduct, and the gate voltage for transistor 506 and transistor 504 (node 523) is equal to the source voltage $V_s$ of transistor 512. $V_s$ for transistor 512 is $V_{cc}$. Thus, if $V_{cc}$ is on, transistors 504 and 506 have a gate voltage of approximately $V_{cc}$ or 1.0 V in the example of FIG. 5. In this case protection transistors 504 and 506 behave substantially as they do in circuit 400 of FIG. 4.

If, however, a power sequencing problem causes $V_{cc}$ to not turn on, or to turn on after the external pin voltage turns on, then $V_g$ of transistor 510 drops to 0 V which is more negative in relation to $V_d$ (0.7 V), and thus transistor 510 turns on. This, in turn, causes the diode chain to conduct current. In this case, the voltage at node 521 equals the sum of the voltages dropped across diodes 520 and 522. As illustrated in FIG. 5, the voltage at node 521 would thus be equal to approximately 1.4 volts, assuming both diodes 520 and 522 drop 0.7 volts each. When the voltage at node 521 is 1.4 V, the voltage ($V_s$) at the source terminal of transistor 510 (node 523) will go to the level of node 521 (which in this example is 1.4 V), since the bulk of transistor 510 is tied to the source terminal and not to $V_{cc}$. However, because $V_{cc}$ is 0 V, transistor 512 is on, and thus the 1.4 V at node 523 will cause conduction from the source to the drain of transistor 512. Thus, the voltage created by the forward voltage drop of diode 520 in the absence of $V_{cc}$ effectively triggers transistor 512 to provide voltage at node 523.

In one embodiment of the present invention, the bulk (n-well) of p-channel transistor 512 is connected to the source terminal of the transistor. When $V_{cc}$ is zero, the voltage at node 523 will not be limited by the internal bulk-drain diode of transistor 512 (typically, 0.7 volts).

When $V_{cc}$ is zero volts, the voltage at node 523 will be equal to the voltage at node 521 as seen across transistors 510 and 512. The voltage at node 521 is effectively dropped across the resistance's of these two diodes. Thus, transistors 510 and 512 effectively form a voltage divider circuit with respect to node 523. If the resistance of transistors 510 and 512 are identical, the voltage at node 523 will be one-half the voltage at node 521. Thus, if the voltage at node 521 is 1.4 volts, corresponding to the voltage drop across diodes 520 and 522, the voltage at node 523 will be 0.7 V. This voltage level acts as a bias voltage which reduces the gate-drain junction voltage for transistors 504 and 506 to approximately 1.8 V, as opposed to 2.5 V if $V_{cc}$ was 0 V and the external voltage was 2.5 V, with no bias voltage reduction.

If a higher or lower voltage is required at node 523, the tap for node 521 could be moved so that the voltage drop is taken for only one diode, three diodes, or any number of diodes in the diode chain. For example, if the tap for node 521 were taken at the junction between diodes 524 and 526, the voltage at node 523 would be one half of 2.1 volts (three times 0.7), or approximately 1.0 volts. This corresponds to the voltage level that is provided by normal $V_{cc}$ levels, in the cases where $V_{cc}$ is 0.9 to 1.0 volts. Thus, by providing a bias voltage to the gates of the input protection transistors in the event of a core supply voltage failure, the pass transistor 510 effectively raises the tolerance of the protection transistors and prevents the input stage from breaking down.

FIG. 5 illustrates one embodiment of the present invention in which the chain of diodes 526, 524, 522, and 520 represents a variable voltage power supply for the pass transistor 510 which serves to trigger conduction from the p-channel transistor in the inverter circuit. The trigger voltage provided by the diode chain depends upon the number and type of diodes used to provide a forward voltage drop. Tapping a single diode provides the forward voltage drop for one diode, tapping two diodes provides the combined forward voltage drop for two diodes, and so on. In an alternative embodiment of the present invention, the variable voltage power supply could be implemented through a variable resistor and a transistor connected in series to $V_{cc}$. Other like circuits which provide variable voltage trigger points to the inverting power supply circuit are also possible.

FIG. 5 also illustrates an embodiment of the present invention in which the power supply circuit connecting $V_{cc}$ to the protection circuits is an inverter circuit composed of a p-channel FET connected in series to an n-channel FET. Although this inverter circuit represents one method of providing $V_{cc}$ to core logic within an IC, $V_{cc}$ may also be supplied through non-inverting transistor circuits, or other logic gates (such as a NAND gate). In these cases, alternate embodiments of the present invention may be implemented in which the pass circuit transmits a voltage from the variable voltage power supply to trigger conduction from an appropriate device within the power supply circuit at a value which based upon a threshold voltage for that device.

In alternative embodiments of the present invention, the threshold voltage at node 523 may be further altered by adjusting the circuit of FIG. 5. For example, in one alternative embodiment, the power supply (inverter) circuit is configured to comprise two p-channel transistors connected in series in place of the single transistor 512. In this embodiment, with two p-channel transistors in the inverter circuit which tie node 523 to $V_{cc}$, the voltage at node 523 will be the voltage at node 521 limited by $V_t$ of the combined transistors. If these threshold voltages are equivalent, the voltage at node 523 will be the maximum of node 521 voltage limited by 2 $V_t$. In this embodiment, the voltage at node 523 will be the lesser of 0.7 V or 0.8 V (=2*0.4 V). Thus, in this example, the voltage at node 523 is 0.7 V, which is the voltage at the gates of protection transistors 504 and 506. This bias voltage reduces the gate-drain junction voltage for transistors 504 and 506 to approximately 1.8 V (2.5 V–0.7 V), as opposed to 2.5 V if $V_{cc}$ was 0 V and the external voltage was 2.5 V, with no bias voltage reduction.

In the foregoing, a circuit has been described for protecting input/output buffer circuits from a failure of an internal supply voltage. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus within an integrated circuit comprising:
   a protection circuit having associated therewith a maximum terminal voltage difference, which, if exceeded, causes failure of the protection circuit;
   a power supply circuit coupled between the protection circuit and an internal power supply provided within the integrated circuit comprising a first p-channel field effect transistor having a first known resistance between a source terminal and a drain terminal when the first p-channel field effect transistor is in a first known state, and having a bulk terminal coupled to a source terminal;
   a pass circuit coupled to the protection circuit and to the power supply circuit at a common node and comprising a second p-channel field effect transistor having a second known resistance between a source terminal and a drain terminal when the second p-channel field effect transistor is in a second known state, and having a bulk terminal coupled to a source terminal, and wherein the pass circuit cooperates with the power supply circuit to reduce a terminal voltage difference across the protection circuit by an amount not limited by the gate-source voltage of the first p-channel field effect transistor, and by an amount not limited by the gate-source voltage of the second p-channel field effect transistor, in the event of failure of the internal power supply; and a variable voltage supply circuit coupling the pass circuit to an external power supply provided from outside the integrated circuit.

2. The apparatus of claim 1, wherein at least one n-channel field effect transistor is coupled to the first p-channel field effect transistor.

3. The apparatus of claim 1, wherein the first known resistance and the second known resistance are used to form a voltage divider at the common node.

4. The apparatus of claim 1, wherein the variable voltage supply comprises a plurality of diodes coupling the pass circuit to the external power supply.

5. A computer system comprising:

an integrated circuit;

an external power supply providing voltage to the integrated circuit;

a protection circuit within the integrated circuit having associated therewith a maximum terminal voltage difference, which, if exceeded, causes failure of the protection circuit;

a power supply circuit within the integrated circuit coupled between the protection circuit and an internal power supply provided within the integrated circuit comprising a first p-channel field effect transistor having a first known resistance between a source terminal and a drain terminal when the first p-channel field effect transistor is in a first known state, and having a bulk terminal coupled to a source terminal;

a pass circuit within the integrated circuit coupled to the protection circuit and to the power supply circuit at a common node and comprising a second p-channel field effect transistor having a second known resistance between a source terminal and a drain terminal when the second p-channel field effect transistor is in a second known state, and having a bulk terminal coupled to a source terminal, and wherein the pass circuit cooperates with the power supply circuit to reduce a terminal voltage difference across the protection circuit by an amount not limited by the gate-source voltage of the first p-channel field effect transistor, and by an amount not limited by the gate-source voltage of the second p-channel field effect transistor, in the event of failure of the internal power supply; and a variable voltage supply circuit within the integrated circuit coupling the pass circuit to the external power supply.

6. The computer system of claim 5, wherein the power supply circuit comprises the at least one n-channel field effect transistor coupled to the first p-channel field effect transistor.

7. The computer system of claim 5, wherein the first known resistance and the second known resistance are used to form a voltage divider at the common node.

8. The computer system of claim 5, wherein the variable voltage supply comprises a plurality of diodes coupling the pass circuit to the external power supply.

9. A method of reducing a terminal voltage difference in a protection circuit within an integrated circuit in the event of failure of an internal power supply within the integrated circuit comprising:

coupling a power supply circuit within the integrated circuit between the protection circuit and the internal power supply, the power supply circuit comprising a first p-channel field effect transistor having a first known resistance between a source terminal and a drain terminal when the first p-channel field effect transistor is in a first known state, and having a bulk terminal coupled to a source terminal;

coupling a pass circuit within the integrated circuit to the protection circuit and to the power supply circuit at a common node, the pass circuit comprising a second p-channel field effect transistor having a second known resistance between a source terminal and a drain terminal when the second p-channel field effect transistor is in a second known state, and having a bulk terminal coupled to a source terminal, and wherein the pass circuit cooperates with the power supply circuit to reduce a terminal voltage difference across the protection circuit by an amount not limited by the gate-source voltage of the first p-channel field effect transistor, and by an amount not limited by the gate-source voltage of the second p-channel field effect transistor, in the event of failure of the internal power supply; and coupling a variable voltage supply circuit within the integrated circuit to an external power supply provided from outside the integrated circuit.

10. The method of claim 9, further comprising using the first known resistance, and the second known resistance to form a voltage divider at the common node.

\* \* \* \* \*